United States Patent

Montcalm et al.

[11] Patent Number: 5,958,605
[45] Date of Patent: Sep. 28, 1999

[54] PASSIVATING OVERCOAT BILAYER FOR MULTILAYER REFLECTIVE COATINGS FOR EXTREME ULTRAVIOLET LITHOGRAPHY

[75] Inventors: Claude Montcalm, Livermore; Daniel G. Stearns, Los Altos; Stephen P. Vernon, Pleasanton, all of Calif.

[73] Assignee: Regents of the University of California, Oakland, Calif.

[21] Appl. No.: 08/969,411

[22] Filed: Nov. 10, 1997

[51] Int. Cl.6 .................................................... B32B 15/04
[52] U.S. Cl. .............................................. 428/627; 378/84
[58] Field of Search ..................................... 428/627, 634, 428/641, 649, 632, 633, 663, 670, 672, 469, 472; 378/84

[56] References Cited

U.S. PATENT DOCUMENTS

| | | | |
|---|---|---|---|
| 4,594,294 | 6/1986 | Eichen et al. | 428/552 |
| 4,619,865 | 10/1986 | Keem et al. | 428/333 |
| 5,163,078 | 11/1992 | Iketaki | 378/85 |
| 5,265,143 | 11/1993 | Early et al. | 378/84 |
| 5,356,662 | 10/1994 | Early et al. | 427/140 |
| 5,646,976 | 7/1997 | Gutman | 378/84 |
| 5,776,550 | 3/1997 | Disam et al. | 427/452 |

OTHER PUBLICATIONS

Tarnishing of Mo/Si Multilayer X–Ray Mirrors, J.H. Underwood, E.M. Gulikson, and Khanh Nguyen, Applied Optics, Dec. 1993, vol. 32, No. 34, pp. 6985–6990.

*Primary Examiner*—Deborah Jones
*Assistant Examiner*—Darlene David
*Attorney, Agent, or Firm*—Daryl S. Grzybicki

[57] ABSTRACT

A passivating overcoat bilayer is used for multilayer reflective coatings for extreme ultraviolet (EUV) or soft x-ray applications to prevent oxidation and corrosion of the multilayer coating, thereby improving the EUV optical performance. The overcoat bilayer comprises a layer of silicon or beryllium underneath at least one top layer of an elemental or a compound material that resists oxidation and corrosion. Materials for the top layer include carbon, palladium, carbides, borides, nitrides, and oxides. The thicknesses of the two layers that make up the overcoat bilayer are optimized to produce the highest reflectance at the wavelength range of operation. Protective overcoat systems comprising three or more layers are also possible.

25 Claims, 4 Drawing Sheets

PASSIVATING OVERCOAT BILAYER FOR MULTILAYER REFLECTIVE COATINGS FOR EXTREME ULTRAVIOLET LITHOGRAPHY

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to an overcoat bilayer for multilayer reflective coatings used in extreme ultraviolet or soft x-ray applications.

2. Description of Related Art

Extreme ultraviolet (EUV) and soft x-ray projection lithography make use of optical elements with highly reflective multilayer coatings. These multilayer coatings typically consist of alternating layers of molybdenum (Mo) and silicon (Si) or molybdenum and beryllium (Be). High EUV reflectivity is essential for lithography applications. A critical limitation to achieving the maximum theoretical peak reflectivity is the oxidation and corrosion of the top layers, which both increases the absorption and degrades the phase coherence of the reflection from these layers.

Although there have been numerous investigations of carbon-based, boron carbide-based, and silicon-based multilayer coatings for EUV mirrors, there has been little work on environmental effects (e.g., oxidation and corrosion) of these structures. Underwood et al. (*Applied Optics* 32:6985 (1993)) investigated the aging effects of Mo—Si multilayers by monitoring the decrease in reflectivity with time. Their experimental results showed a degradation of the Mo—Si multilayer reflectance caused by the oxidation of the topmost layer of molybdenum. Underwood et al. identified the oxidation of the molybdenum layer as a potential problem in soft x-ray projection lithography. The proposed solutions were to make silicon the topmost layer, to store the optical elements in an inert atmosphere or vacuum, or to remove the oxidized surface by sputtering or chemical etching. Underwood et al. did not investigate the use of passivating layers.

Extreme ultraviolet and soft x-ray projection lithography benefit substantially from multilayer coatings with maximum reflectivity. Any improvement in reflectivity translates into greater process throughput in the manufacture of microelectronic devices. Thus, there is a continuing need to improve the coatings and thereby increase production of devices made using lithographic techniques. The use of passivating overcoat layers as described herein is the best approach for maximizing the reflectivity of the EUV multilayer coatings.

SUMMARY OF THE INVENTION

The present invention is a passivating overcoat bilayer for multilayer reflective coatings for soft x-ray or extreme ultraviolet applications and the method for making such layers. These passivating layers are useful for reflective optical coatings for soft x-ray and extreme ultraviolet wavelengths in applications such as microscopy, astronomy, spectroscopy, laser research, laser cavities and optics, synchrotron optics, and projection lithography.

A passivating overcoat bilayer (also called a "capping" bilayer) is deposited on top of a multilayer coating to prevent oxidation and corrosion of the multilayer coating, thereby improving the EUV optical performance. The multilayer coating can comprise alternating layers of a variety of materials, such as molybdenum-silicon, molybdenum carbide-silicon, molybdenum-beryllium, and molybdenum carbide-beryllium. The passivating bilayer comprises a layer of silicon or beryllium underneath at least one top layer of an elemental material or compound that resists oxidation and corrosion. The overcoat bilayer can be extended to a trilayer (or multilayer) by the addition of a third layer between the two original layers to improve the stability of the overcoat. This third layer must be more chemically compatible with the two outer layers than the two layers would be if adjacent to one another. An overcoat composed of two layers is generally sufficient; for the purposes of this disclosure, the bilayer embodiment will be emphasized.

Oxidation resistant materials for the top layer (or layers) may include pure elements, such as carbon and palladium, or compound materials, such as carbides, borides, nitrides, and oxides. Specific examples include molybdenum carbide, boron carbide, molybdenum boride, boron nitride, molybdenum oxide, silicon nitride, beryllium oxide, silicon carbide, and silicon oxide.

The thickness of each layer that makes up the overcoat bilayer is in the range of about 0.5 to 5 nanometers, and the thicknesses are selected to produce the highest reflectance at the EUV wavelength range of operation. The thickness of the overcoat bilayer will typically be different from the thickness of the pairs of alternating layers in the underlying multilayer coating. The thickness of the two layers in the overcoat are individually optimized so as to provide sufficient chemical protection and to maximize EUV optical performance. To date, these capped multilayer mirrors have demonstrated normal incidence reflectivity of at least 67% in the wavelength range of 13.0–13.5 nm for Mo—Si, and at least 69% in the wavelength range of 11.2–12.0 nm for Mo—Be.

DETAILED DESCRIPTION OF THE INVENTION

Figure 1:
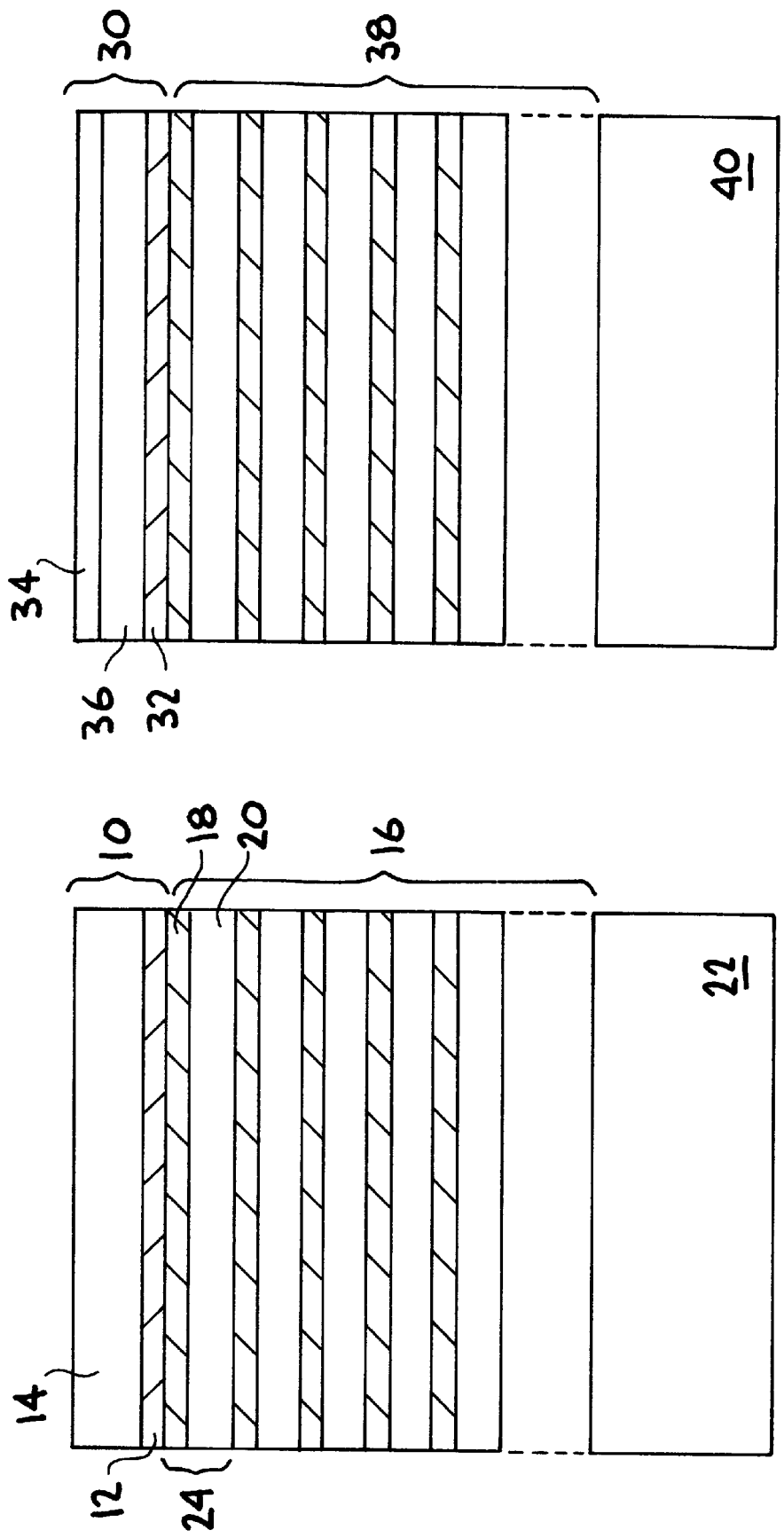
FIG. 1A shows the design of a multilayer reflective coating with an overcoat bilayer according to the present invention.
FIG. 1B shows the design of a multilayer reflective coating with an overcoat trilayer according to the present invention.

The present invention is a passivating overcoat bilayer for a multilayer reflective coating and is shown schematically in FIG. 1A. The overcoat bilayer 10 is made up of a bottom layer 12, which comprises either silicon or beryllium, and a top layer 14, which comprises a material that resists corrosion and oxidation and protects the underlying layers from oxidation. The bottom layer 12 is deposited on a multilayer coating 16, which typically comprises alternating layers of an absorber material 18 and a spacer material 20. The multilayer coating 16 is deposited on a substrate 22.

A multilayer coating 16 that is designed for applications in extreme ultraviolet (EUV) lithography is typically made of a periodic stack of 40–100 alternating layers of molybdenum (Mo) and silicon (Si), or molybdenum and beryllium (Be). Although other structures are possible (e.g., non-periodic stacks, multilayer stacks with other materials or with more than two materials), the combinations of Mo—Si and Mo—Be exhibit unusually high normal incidence reflectivity (at least 60%) in the EUV wavelength region (i.e., less than about 15 nanometers). When Mo—Si or Mo—Be is used for the multilayer stack, the topmost layer of the multilayer coating 16 would typically be molybdenum (the absorber material). However, since molybdenum is not stable in air, the additional overcoat bilayer is needed. The multilayer coating 16 for lithographic applications is typically deposited on an optically flat or figured substrate 22 with an ultra-smooth finish such as super-polished fused silica or low expansion materials.

The bottom layer 12 of the overcoat bilayer 10 is made up of the spacer material, either silicon or beryllium. The top layer 14 is deposited or grown on the bottom layer 12 and comprises a material that resists oxidation and corrosion, and has a low chemical reactivity with common atmospheric gas species such as oxygen, nitrogen, and water vapor. For purposes of this disclosure, "deposition" of the top layer is intended to encompass the concepts of both "depositing" and "growing". This top layer 14 serves to chemically passivate and protect the underlying multilayer coating 16 and to preserve the high reflectance of the coating.

The present invention is not limited to an overcoat bilayer, but may also encompass a third layer to form a trilayer, as shown schematically in FIG. 1B. The overcoat trilayer 30 is made up of the bottom layer 32, a protective top layer 34, and an intermediate layer 36 deposited between the top 34 and bottom 32 layers. The bottom layer 32 comprises either silicon or beryllium and is deposited on the multilayer coating 38 formed on a substrate 40. The top layer 34 comprises a material that resists corrosion and oxidation. The intermediate layer 36 must be chemically compatible with both top 34 and bottom 32 layers, and typically comprises a corrosion resistant material. The intermediate layer 36 may serve to stabilize the overcoat 30 in cases where the top 34 and bottom 32 layers are more compatible with the intermediate layer 36 than they are with each other. The intermediate layer 36 or intermediate layers (as in an overcoat quadrilayer) may comprise a compound that is a mixture of the materials of the outer layers.

Appropriate materials for the top layer 14, 34 and any intermediate layers 36 include compound materials such as carbides, borides, nitrides, and oxides, and pure elements having high resistance to corrosion and oxidation, such as carbon, palladium, platinum, and gold. The selected materials must be able to form continuous and smooth layers when deposited. Preferred materials include molybdenum carbide, palladium, carbon, boron carbide, molybdenum boride, boron nitride, molybdenum oxide, silicon nitride, silicon carbide, beryllium oxide, and silicon oxide. Since the carbides, borides, nitrides, and oxides are hard materials, the top layer also mechanically protects the underlying layers from abrasion.

The passivating overcoat can be grown using a vapor phase deposition technique (e.g., sputtering). This method can be incorporated into the multilayer deposition system (e.g., magnetron sputtering with argon plasma) so that the multilayer stack can be encapsulated in situ without exposure to the atmosphere. Alternatively, the overcoat can be grown by chemical reaction. For example, where the top layer is an oxide, the top layer can be grown by controlled oxidation of a layer of a metal such as molybdenum, beryllium, or silicon.

The thicknesses of the bottom layer 12 and the top layer 14 of the overcoat bilayer 10 are chosen to produce the highest reflectance at the EUV wavelength of operation, in a similar manner to how the thicknesses of both layers in the underlying periodic multilayer stack 16 were determined.

Usually the best reflecting multilayer geometry is a quarter-wave stack, where the optical thickness of each layer is equal to a quarter of the wavelength of interest at normal incidence. (The optical thickness of a layer is the product of the geometrical or metric thickness and the refractive index of the material.) In the quarter-wave stack, the beams reflected from each interface are in phase and add constructively. This design is ideal when both materials in the stack are non-absorbing, and still remains the best when the extinction coefficients of the two materials are similar. However, when the absorption of one of the two materials is larger, as in the case of EUV multilayer mirrors, the design of the stack must be modified to reduce the overall absorption. The thickness of the absorber is reduced, while the period thickness 24 is kept constant. Therefore, thicknesses are determined by the trade-off between maximizing the constructive interference of the beams reflected at each interface and minimizing the overall absorption to enable more interfaces to contribute to the reflectance.

In the present invention, the thickness of the overcoat bilayer 10 is adjusted to provide the best phase-matching with the underlying multilayer coating 16 in order to achieve the highest EUV reflectance. The thickness of the overcoat bilayer 10 is typically different from the period thickness 24 of the underlying multilayer coating 16, mainly because of the different materials used in the overcoat bilayer 10, but also because of the layer to air (vacuum) interface at the surface. For the Mo—Si and Mo—Be systems, the thickness of each layer in the overcoat bilayer is in the range of 0.5 to 5 nanometers.

In practice, the optimal thickness of each layer in the overcoat bilayer 10 is determined by performing a series of calculations of reflectance versus wavelength, where the thickness of the layer of interest is incremented after each calculation while the thickness of the other layers remains fixed. More specifically, once having performed the calculations with a gradually incremented top layer thickness while the thickness of the bottom layers is fixed, one must select the top layer thickness that yielded to the highest peak reflectance. Similarly, one can fix the top layer thickness and increment the thickness of the bottom layer after each calculation of the multilayer reflectance. This approach may be extended to an overcoat with three or more layers.

Calculation of the reflectance curves are performed using known mathematical relationships assuming ideal multilayer structure, i.e., with perfect interfaces. The optical constants (i.e., refractive index and extinction coefficient) of the coating materials used for the calculations were derived using the scattering factor tables of Henke et al. [B. L. Henke, E. M. Gullikson, and J. C. Davis, *At. Data Nucl. Data Tables* 54, 181–342 (1993)] and assuming bulk density for the film.

Figure 2:
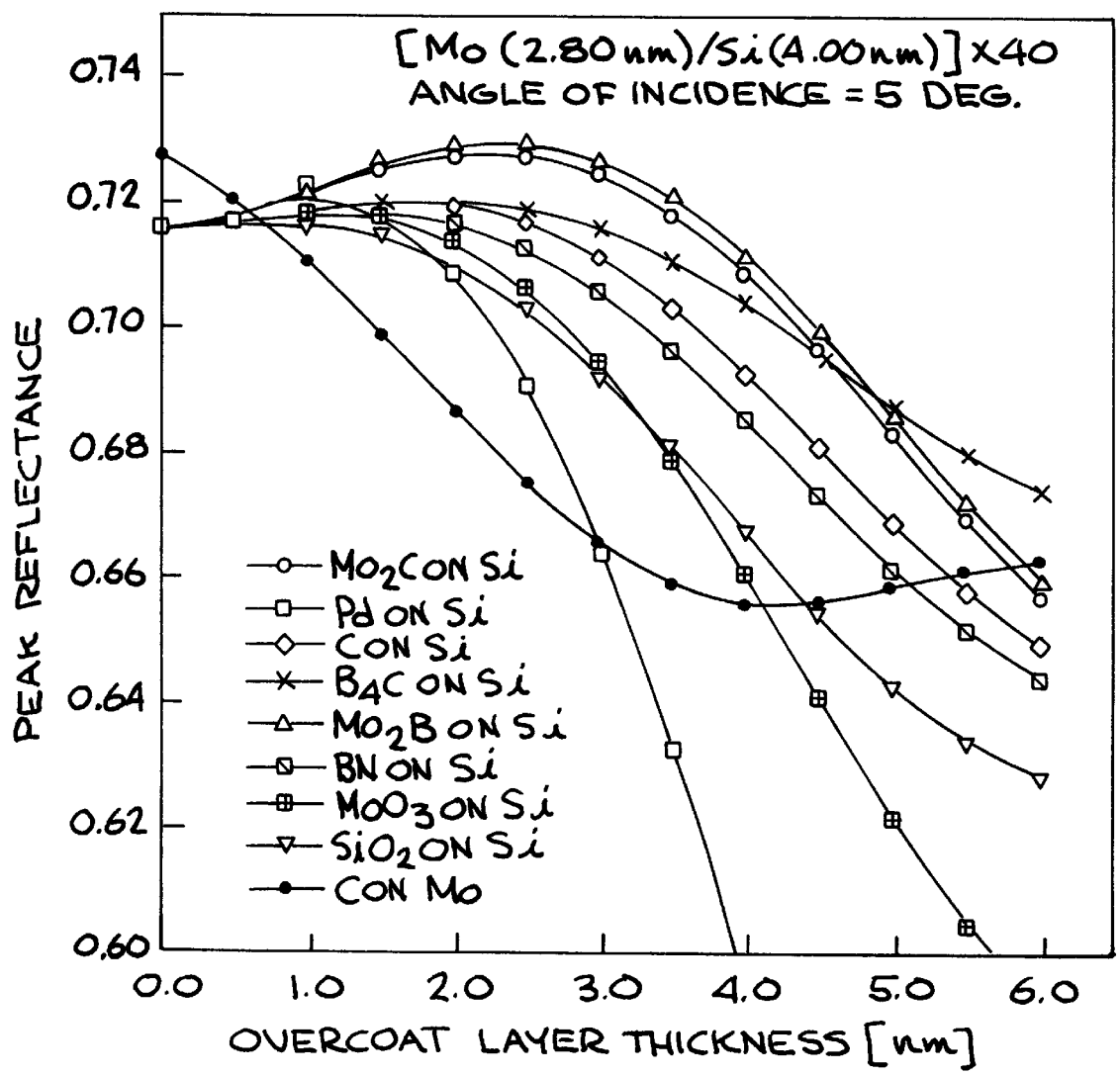
FIG. 2 shows the peak reflectivity of a Mo—Si multilayer coating as a function of the thickness of the top layer of the overcoat bilayer for various materials.

FIG. 2 shows the peak reflectivity of a Mo—Si multilayer at 5.0 degrees from normal incidence as a function of the thickness of the top layer of the overcoat bilayer for various materials: $Mo_2C$, Pd, C, $B_4C$, $Mo_2B$, BN, $MoO_3$, and $SiO_2$ on Si and C on Mo. The multilayer coating is made of 40 alternating layers of Mo (2.80 nm thick) and Si (4.00 nm thick). The bottom layer of the overcoat bilayer is Si in all cases except one, where a carbon overcoat layer deposited on Mo is shown for comparison. For these calculations, the thickness of the bottom layer is the same as for the multilayer coatings, i.e., 4.00 nm.

For an uncapped multilayer coating, the oxidation of the topmost silicon layer in Mo—Si coatings reduced the normal incidence reflectivity below the theoretical maximum to a maximum normal incidence reflectivity of 66% in the wavelength range of 13.0–13.5 nm. FIG. 2 clearly shows that an overcoat top layer of some pure elements, carbides, borides, nitrides, or oxides of the appropriate thickness will maintain the reflectivity to greater than 70%.

Figure 3:
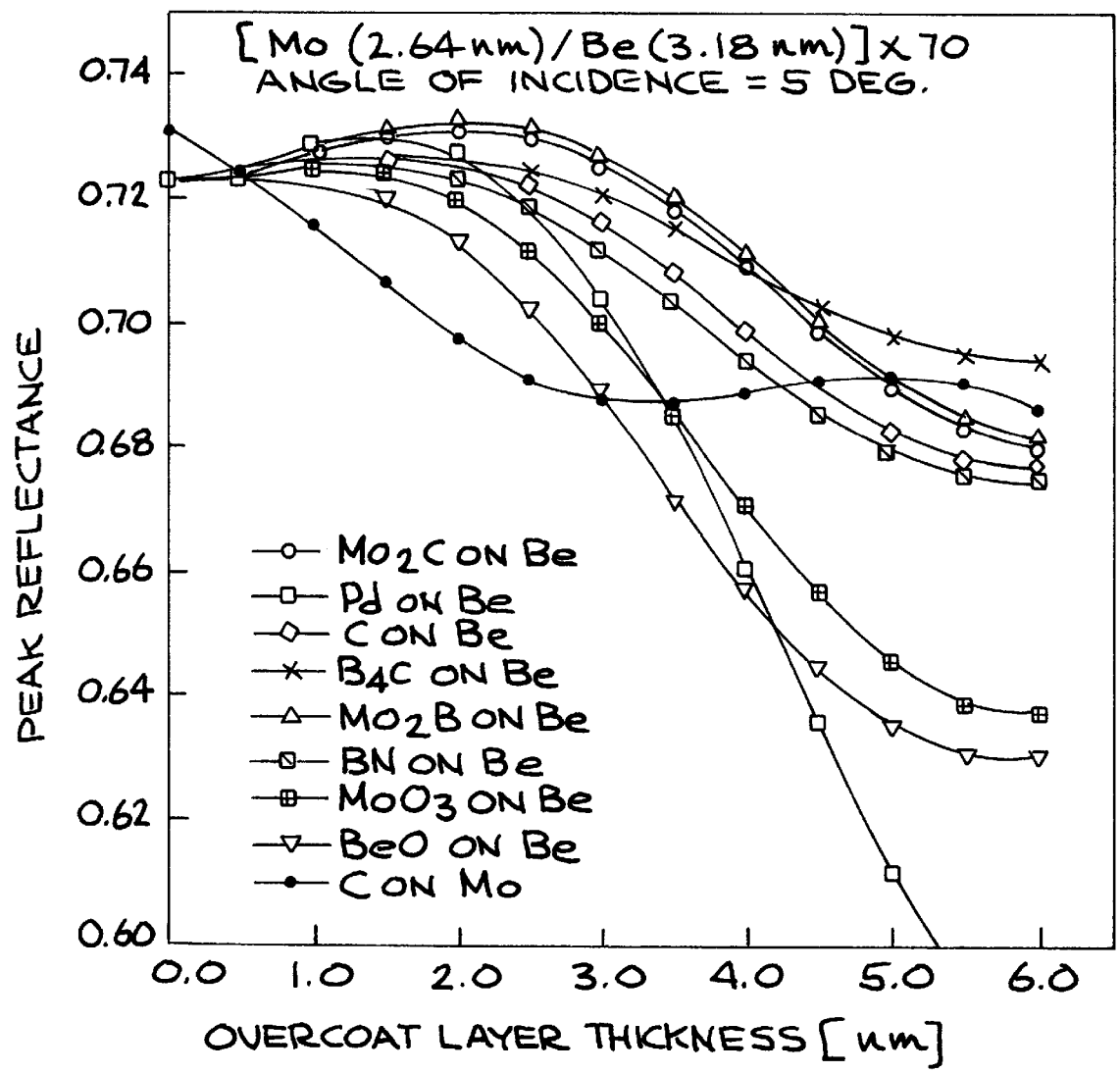
FIG. 3 shows the peak reflectivity of a Mo—Be multilayer coating as a function of the thickness of the top layer of the overcoat bilayer for various materials.

FIG. 3 shows the variation of the peak reflectivity of a Mo—Be multilayer at 5.0 degrees from normal incidence as a function of the thickness of the top layer of the overcoat bilayer for various materials: $Mo_2C$, Pd, C, $B_4C$, $Mo_2B$, BN, $MoO_3$, BeO on Be and C on Mo. The multilayer coating is made of 70 alternating layers of Mo (2.64 nm thick) and Be (3.18 nm thick). The bottom layer of the overcoat bilayer is Be in all cases except one, where a carbon overcoat layer deposited on Mo is shown for comparison. For these calculations, the thickness of the bottom layer is the same as for the multilayer coatings, i.e., 3.18 nm.

Previous metal beryllium multilayer coatings had a maximum normal incidence reflectivity of 68% in the wavelength range of 11.2–12.0 nm. Oxidation of the topmost beryllium layer reduced the normal incidence reflectivity with respect to the theoretical maximum. FIG. 3 clearly shows that an overcoat top layer of some pure elements, carbides, borides, nitrides, or oxides having appropriate thickness will maintain the reflectivity to greater than 71%.

FIGS. 2 and 3 show that the optimum thickness of the top layer of the overcoat bilayer is in the range of about 1.0 to 2.5 nm, assuming that the top layer forms a smooth, continuous, and homogenous layer that does not react with contaminants present in the ambient air. To form a good chemical barrier, however, there are cases where the top layer of the overcoat bilayer must be thicker than the calculated optimal thickness. In these cases where the thickness of the top layer must be increased, the thickness of the bottom layer must be decreased simultaneously to partially compensate for the loss of phase matching. The metric thickness of the bottom layer must then be optimized, to allow for a thicker top layer.

Figure 4:
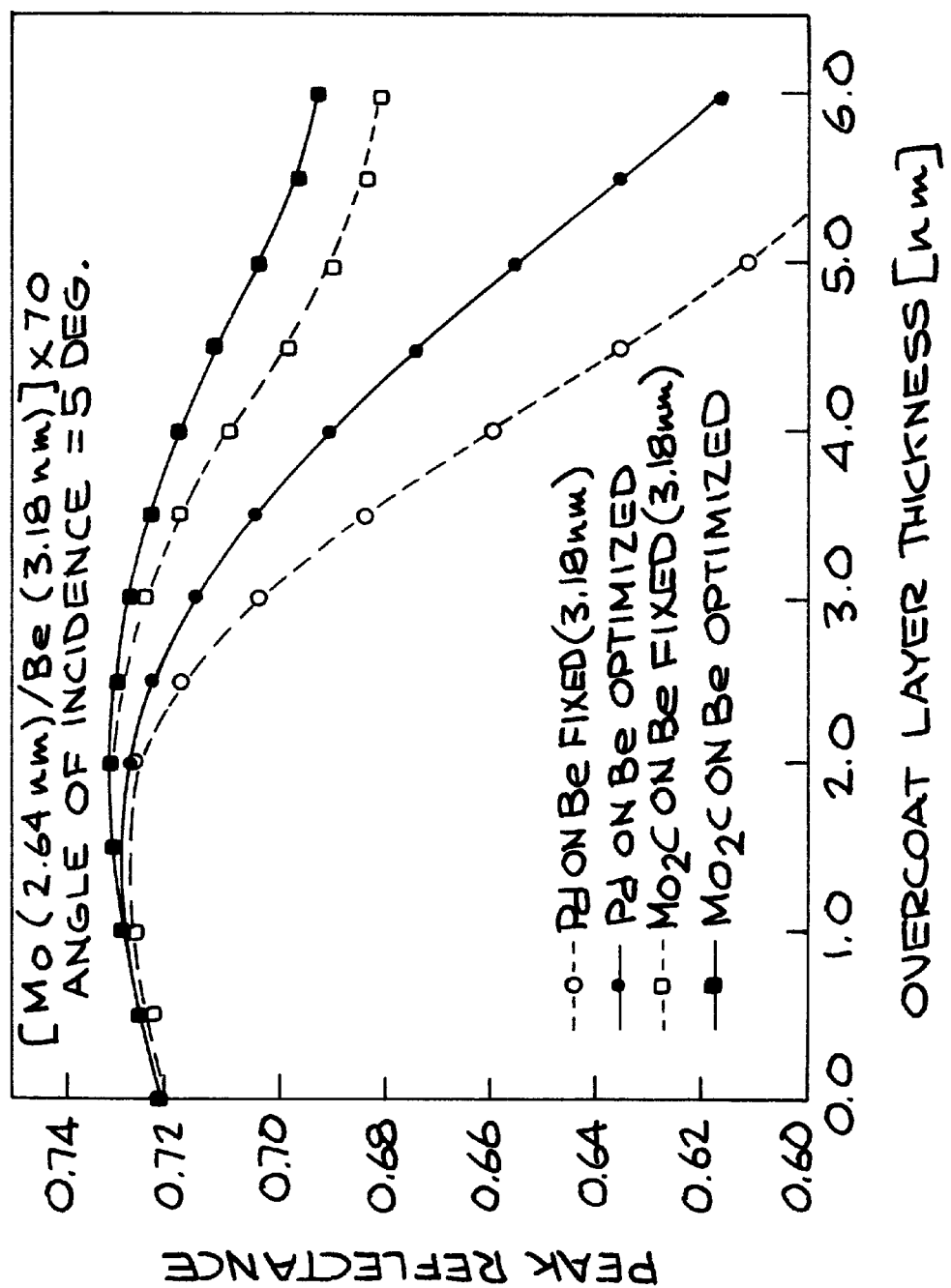
FIG. 4 shows the peak reflectivity of a Mo—Be multilayer coating as a function of the thickness of a $Mo_2C$ or Pd layer on top of a Be layer with fixed or optimized thickness.

This optimization of the top and bottom layers of the overcoat bilayer is illustrated in FIG. 4. FIG. 4 shows the peak reflectivity of a 70 layer Mo—Be multilayer coating at 5 degrees from normal incidence as a function of the thickness of the top layer of the overcoat bilayer when the bottom layer has a fixed thickness and when its thickness has been optimized for each top layer thickness. The bottom layer in this example is Be, and the top layer is either $Mo_2C$ or Pd. The thickness of the bottom layer is 3.18 nm in the fixed case, and varies from 0.50 nm to 3.18 nm in the optimized case. The thickness of the Mo layers in the multilayer stack is 2.64 nm; the thickness of the Be layers in the multilayer stack is 3.18 nm.

FIG. 4 shows that peak reflectivity falls off more rapidly as the thickness of the top layer ($Mo_2C$ or Pd) is increased above its optimum thickness on a 3.18 nm thick Be bottom layer. When the thickness of the Be bottom layer is re-optimized for a thicker top layer of $Mo_2C$ or Pd, the peak reflectivity remains higher. Therefore, the preferred overcoat bilayer comprises (1) a Be or Si bottom layer, which may be thinner than in the Be or Si layers in the underlying multilayer stack, and (2) a top layer that is correspondingly thicker to provide better protection and preserve the optimum phase matching with the underlying multilayer stack. In the case of an overcoat multilayer (i.e., three or more), the thickness of each layer must be optimized in the same manner as a bilayer to maximize EUV performance while providing a top layer that is effective in resisting corrosion and oxidation and protecting the underlying layers.

The foregoing description of preferred embodiments of the invention is presented for purposes of illustration and description and is not intended to be exhaustive or to limit the invention to the precise form disclosed. Many modifications and variations are possible in light of the above teaching.

We claim:

1. A passivating overcoat bilayer for a multilayer reflective coating designed for use in extreme ultraviolet or soft x-ray applications, comprising:

a bottom layer comprising silicon or beryllium deposited on a multilayer reflective coating; and at least one top layer deposited on the bottom layer, wherein the top layer comprises a material that resists oxidation and corrosion and protects the underlying layers from oxidation.

2. The overcoat bilayer as recited in claim 1, wherein the top and bottom layers of the overcoat bilayer have optimum thicknesses, wherein the thicknesses of both layers are selected such that the bilayer overcoat is phase-matched with the underlying multilayer coating.

3. The overcoat bilayer as recited in claim 1, wherein the top and bottom layers of the overcoat bilayer have thicknesses, wherein the thickness of the top layer is selected to protect the underlying layers from oxidation, and wherein the thickness of the bottom layer is selected such that the bilayer overcoat is phase-matched with the underlying multilayer coating.

4. The overcoat bilayer as recited in claim 1, wherein the top layer is selected from pure elements, carbides, oxides, borides, and nitrides.

5. The overcoat bilayer as recited in claim 4, wherein the top layer is selected from molybdenum carbide, palladium, platinum, gold, carbon, boron carbide, molybdenum boride, boron nitride, molybdenum oxide, silicon nitride, silicon carbide, beryllium oxide, and silicon oxide.

6. The overcoat bilayer as recited in claim 1, wherein the top and bottom layers of the overcoat bilayer have thicknesses that are optimized to maximize the normal incidence reflectance at an operating wavelength of less than about 15 nanometers.

7. The overcoat bilayer as recited in claim 1, wherein the top layer has a thickness ranging from about 0.5 nanometers to about 5 nanometers.

8. The overcoat bilayer as recited in claim 1, wherein the bottom layer has a thickness ranging from about 0.5 nanometers to about 5 nanometers.

9. The overcoat bilayer as recited in claim 1, wherein the underlying multilayer reflective coating comprises a plurality of pairs of underlying layers, and the underlying layers have a reflectance greater than about 60% at an operating wavelength of less than about 15 nanometers.

10. The overcoat bilayer as recited in claim 9, wherein each underlying pair of layers comprises a first layer comprising molybdenum and a second layer comprising silicon.

11. The overcoat bilayer as recited in claim 9, wherein each underlying pair of layers comprises a first layer comprising molybdenum and a second layer comprising beryllium.

12. The overcoat bilayer as recited in claim 9, wherein each underlying pair of layers comprises a layer comprising molybdenum carbide.

13. The overcoat bilayer as recited in claim 1, wherein the overcoat bilayer and the underlying multilayer reflective coating have a normal incidence reflectivity of at least about 60% at an operating wavelength of less than about 15 nanometers, and wherein the underlying coating comprises molybdenum and silicon.

14. The overcoat bilayer as recited in claim 1, wherein the overcoat bilayer and the underlying multilayer reflective coating have a normal incidence reflectivity of at least about 60% at an operating wavelength of less than about 15 nanometers, and wherein the underlying coating comprises molybdenum and beryllium.

15. The overcoat bilayer as recited in claim 1, wherein the overcoat bilayer further comprises an intermediate layer deposited between the top layer and the bottom layer, wherein the intermediate layer is chemically compatible with both top and bottom layers and comprises a material that resists corrosion.

16. The overcoat bilayer as recited in claim 15, wherein the intermediate layer is selected from pure elements, carbides, oxides, borides, and nitrides.

17. The overcoat bilayer as recited in claim 16, wherein the intermediate layer is selected from molybdenum carbide, carbon, boron carbide, molybdenum boride, boron nitride, molybdenum oxide, silicon nitride, silicon carbide, beryllium oxide, and silicon oxide.

18. The overcoat bilayer as recited in claim 15, wherein the top, intermediate, and bottom layers of the overcoat have thicknesses that are optimized to maximize the normal incidence reflectivity at an operating wavelength of less than about 15 nanometers.

19. The overcoat bilayer as recited in claim 15, wherein the top, intermediate, and bottom layers of the overcoat have optimum thicknesses, and wherein the thicknesses of all layers are selected such that the overcoat is phase-matched with the underlying multilayer coating.

20. The overcoat bilayer as recited in claim 15, wherein the top, intermediate, and bottom layers of the overcoat have thicknesses, and wherein the thickness of the top layer is selected to protect the underlying layers from oxidation, and wherein the thickness of the intermediate and bottom layers are selected such that the overcoat is phase-matched with the underlying multilayer coating.

21. A method for forming a passivating overcoat bilayer for a multilayer reflective coating designed for use in extreme ultraviolet or soft x-ray applications, comprising:

providing an underlying multilayer reflective coating;

depositing on the underlying multilayer coating a bottom layer comprising beryllium or silicon; and depositing on the bottom layer at least one top layer comprising a material that resists oxidation and corrosion and protects the underlying layers from oxidation.

22. The method as recited in claim 21, wherein the deposition of the bottom layer or the top layer is carried out by vapor phase deposition.

23. The method as recited in claim 21, wherein the deposition of the top layer is carried out by controlled oxidation.

24. The method as recited in claim 21, wherein the top layer comprises a metal oxide, and deposition of the top layer is carried out by depositing a layer of metal and growing the metal oxide by controlled oxidation of the metal layer.

25. The method as recited in claim 21, further comprising depositing an intermediate layer on the bottom layer before depositing the top layer.

* * * * *